United States Patent
Zhang et al.

(10) Patent No.: US 9,812,527 B2
(45) Date of Patent: Nov. 7, 2017

(54) GROWTH OF SEMICONDUCTORS ON HETERO-SUBSTRATES USING GRAPHENE AS AN INTERFACIAL LAYER

(71) Applicants: Yong Zhang, Charlotte, NC (US); Raphael Tsu, Huntersville, NC (US); Naili Yue, Oakland, CA (US)

(72) Inventors: Yong Zhang, Charlotte, NC (US); Raphael Tsu, Huntersville, NC (US); Naili Yue, Oakland, CA (US)

(73) Assignee: THE UNIVERSITY OF NORTH CAROLINA AT CHARLOTTE, Charlotte, NC (US)

( * ) Notice: Subject to any disclaimer, the term of this patent is extended or adjusted under 35 U.S.C. 154(b) by 0 days.

(21) Appl. No.: 15/463,804

(22) Filed: Mar. 20, 2017

(65) Prior Publication Data

US 2017/0194437 A1 Jul. 6, 2017

Related U.S. Application Data

(63) Continuation of application No. 14/786,029, filed as application No. PCT/US2014/039596 on May 27, 2014, now Pat. No. 9,601,579.

(60) Provisional application No. 61/827,047, filed on May 24, 2013.

(51) Int. Cl.
*H01L 21/00* (2006.01)
*H01L 29/16* (2006.01)
*H01L 29/165* (2006.01)
*H01L 21/02* (2006.01)

(52) U.S. Cl.
CPC .......... *H01L 29/16* (2013.01); *H01L 21/0259* (2013.01); *H01L 21/0262* (2013.01); *H01L 21/02444* (2013.01); *H01L 21/02631* (2013.01); *H01L 21/02658* (2013.01); *H01L 29/165* (2013.01); *H01L 29/1606* (2013.01)

(58) Field of Classification Search
None
See application file for complete search history.

(56) References Cited

U.S. PATENT DOCUMENTS

| | | | |
|---|---|---|---|
| 5,134,090 | A | 7/1992 | Bean et al. |
| 9,601,579 | B2 * | 3/2017 | Zhang ............... H01L 21/02658 |
| 2008/0187776 | A1 | 8/2008 | Nakahara et al. |
| 2010/0255984 | A1 | 10/2010 | Sutter et al. |
| 2011/0014457 | A1 | 1/2011 | Quitoriano et al. |
| 2011/0130494 | A1 | 6/2011 | Penicaud et al. |
| 2011/0143034 | A1 | 6/2011 | Ahn et al. |
| 2011/0143101 | A1 | 6/2011 | Sandhu |

(Continued)

OTHER PUBLICATIONS

Ashjaran et al., "Graphene as Single Layer of Carbon Atoms: Perusal on Structure, Properties and Applications." Sep.-Oct. 2014, Research Journal of Pharmaceutical, Biological and Chemical Sciences, 5(5), pp. 327-335.*

(Continued)

*Primary Examiner* — Reema Patel
(74) *Attorney, Agent, or Firm* — R. Brian Drozd

(57) ABSTRACT

Graphene is used as an interfacial layer to grow Si and other semiconductors or crystalline materials including two-dimensional Si and other structures on any foreign substrate that can withstand the growth temperature without the limitation matching condition typically required for epitaxial growth.

20 Claims, 5 Drawing Sheets

(56) References Cited

U.S. PATENT DOCUMENTS

| | | |
|---|---|---|
| 2012/0138903 A1 | 6/2012 | Chung et al. |
| 2012/0141799 A1 | 6/2012 | Kub et al. |
| 2013/0160701 A1* | 6/2013 | Arnold .................. B82Y 40/00 117/95 |
| 2013/0288457 A1 | 10/2013 | Wei et al. |

OTHER PUBLICATIONS

Oct. 24, 2014 Search Report issued in International Patent Application No. PCT/US14/39596.
Oct. 24, 2014 Written Opinion issued in International Patent Application No. PCT/US14/39596.
Feb. 16, 2016 Office Action Issued in U.S. Appl. No. 14/786,029.
Aug. 24, 2016 Notice of Allowance issued in U.S. Appl. No. 14/786,029.

* cited by examiner

GROWTH OF SEMICONDUCTORS ON HETERO-SUBSTRATES USING GRAPHENE AS AN INTERFACIAL LAYER

CROSS-REFERENCE TO RELATED APPLICATION

This application claims the benefit of priority to U.S. patent application Ser. No. 14/786,029, filed Oct. 21, 2015, which claims priority to U.S. Provisional Patent Application No. 61/827,047, filed May 24, 2013, the entire contents of which are incorporated by reference in its entirety.

BACKGROUND

It is a general interest to be able to grow a semiconductor material on a foreign substrate for either obtaining new properties of the heterojunction or simply to reducing the material usage and/or achieving processing flexibility. Many approaches have been used for epitaxial growth of a semiconductor layer on a substrate with a different lattice structures. Typically, however, a lattice mismatch will result and thus, leads to the formation of defects and cracks. Additionally, a chemical mismatch may result, leading to electronic coupling.

SUMMARY

Embodiments of the present application solve the above issues. For example, in the present application, graphene is used as an interfacial layer to grow semiconductors. Graphene is better and simpler interfacial layer for the growth on highly mismatched substrates.

Thus, embodiments of the present application describe how graphene can be used as an interfacial layer to grow Si and other semiconductors or crystalline materials including two dimensional Si structure on practically any foreign substrate that can withstand the growth temperature without the limitation matching condition typically required for epitaxial growth.

In one embodiment, an electronic device may include a substrate, a graphene layer deposited on the substrate, and a semiconductor material deposited on the graphene layer.

In another embodiment, a method may include providing a substrate, depositing a graphene layer on the substrate, and depositing, using one of e-beam evaporation, molecular beam epitaxy or atomic layer deposition, a silicon epitaxial layer on the graphene layer.

Various advantages result from using graphene as an interfacial layer, including conductivity, transparency, high atomic density, chemically inactivity property, high melting point, adaptability to many substrates, and easy lift-off capabilities.

BRIEF DESCRIPTION OF THE DRAWINGS

Aspects of the present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

Figure 1A:
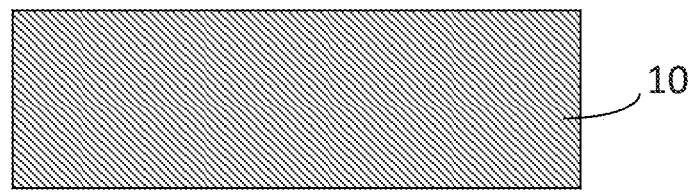
FIGS. 1A, 1B, and 1C are diagrammatic representations (through a common cross sectional view) of a substrate and a graphene interfacial layer according to one embodiment.

Embodiments of the present invention now will be described more fully hereinafter in the following detailed description, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing embodiments of the present invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

It is a general interest to be able to grow a semiconductor material on a foreign substrate for either obtaining new properties of the heterojunction or simply to reducing the material usage and/or achieving processing flexibility.

A single atomic layer of carbon ("C"), called graphene, is transparent and conductive. Embodiments of the present application describe how graphene can be used as an interfacial layer to grow Si and other semiconductors or crystalline materials including two-dimensional (2-D) structures based on silicon and other semiconductors, such as the graphene analogy of Si, also known as silicene, and other variations of 2-D structures, on practically any foreign substrate that can withstand a predetermined growth temperature (described below) without the limitation matching condition typically required for epitaxial growth.

In some embodiments of the present invention, silicon epi-layers are grown on graphene layer transferred on 300 nm $SiO_2$/Si or directly on graphite substrate using e-beam evaporation under ultra high vacuum ("UHV"), such as by a pressure of about $10^{-10}$ Torr. The substrate was resistively heated up to 700° C. at which the adsorbed Si atoms could nucleate and grow into a uniformly crystallized atomic structure. To improve the structural homogeneity, the sample was rotated during growth. Also, liquid nitrogen ("LN") was circulated through the shroud in the wall of growth chamber to cool down the inner wall of the chamber to prevent the residual depositions on the wall from re-evaporation, avoid the incorporation of impurities.

The inventors have demonstrated the feasibility of using a graphene interfacial layer to grow a high quality Si on foreign substrates, including graphite, graphene on Si/$SiO_2$. The grown Si thin-films were characterized with Raman spectroscopy as well as SEM as shown by the figures, as is discussed more in depth later.

Referring now to FIG. 1A, there is illustrated a substrate 10 that can be employed in one embodiment of the present disclosure. The substrate 10 that can be employed in the present disclosure may be any foreign substrate that can withstand a predetermined growth temperature without the limitation matching condition typically required for epitaxial growth. The substrate may be rigid or flexible. Additionally, the substrate may be any heterogeneous substrate (also referred to herein as a "hetero-substrate") and may include, for example, one or more of: a semiconductor material, glass, a ceramic, metal, a plastic, and/or any other material.

In one embodiment, the substrate 10 that is employed is a $SiO_2$/Si substrate, on which the graphene interfacial layer may be deposited or transferred thereon. In another embodiment of the present disclosure, the substrate 10 is comprised of quartz, on which the graphene interfacial layer may be deposited or transferred thereon. In yet another embodiment, the substrate 10 is a graphite substrate, which can be viewed as that the topmost graphene layer is supported by many stacked graphene layers, on which silicon or other semiconductors may be deposited.

The substrate 10 that may be employed in the present disclosure may have any thickness, such as from a few hundred microns to a few millimeters. In another embodiment, the substrate 10 that is employed may have a thickness from a few tens of microns to a few millimeters. The substrate 10 can have other thicknesses that are above and/or below the ranges mentioned above.

Figure 1B:
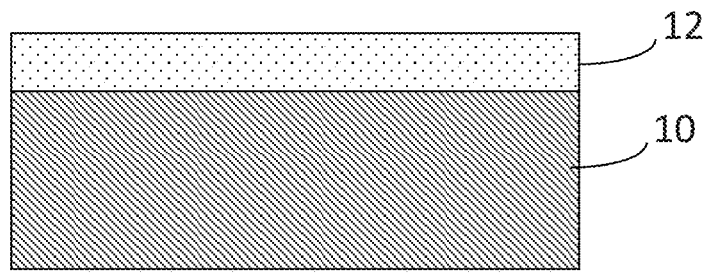

Referring to FIG. 1B, there is illustrated the substrate 10 after forming a layer of graphene 12 on an exposed surface of the substrate 10. In some embodiments, the layer of graphene 12 may serve as various purposes, such as a transparent and conductive electrode of a semiconductor device, such as, for example, photovoltaic devices, solar cells, flat panel displays, OLED devices, touch screen devices, or the like.

The term "graphene" as used throughout the present disclosure denotes a one-atom-thick planar sheet of sp2-bonded carbon atoms that are densely packed in a honeycomb crystal lattice according to some embodiments. The graphene employed in the present disclosure may have a two-dimensional (2D) hexagonal crystallographic bonding structure.

The layer of graphene that can be used in the present disclosure may be a contiguous layer of graphene that can be comprised of single-layer graphene or any combination of a plurality of graphene layers. In the illustrative embodiment of FIG. 1, a single layer of graphene is used for ease of illustration.

The layer of graphene can be formed utilizing any deposition process, such as, for example, molecular beam epitaxy (MBE), chemical vapor deposition (CVD), plasma enhanced chemical vapor deposition (PECVD), and ultraviolet (UV) assisted CVD. In one embodiment, the layer of graphene is formed by CVD.

In one embodiment, the deposition of the layer of graphene on the exposed surface of the substrate can be performed directly on metallic substrates, such as Cu and Ni. The deposition process that can be used in the present disclosure for forming the layer of graphene includes utilizing any known carbon sources including, for example, benzene, propane, ethane and other hydrocarbons, and other carbon-containing gases.

In one embodiment, graphene can be transferred to the substrate (e.g., quartz, stainless steel) to be used for the growth of the intended material, after graphene was first grown on a different substrate, such as Cu and Ni.

In one embodiment, a patterned graphene template (e.g., graphene disks, graphene nanowires) can be used to grow the epitaxial material with the similar features of the template. Such template is formed on a Si substrate by employing a technique to selectively deposit SiC features on Si then convert them into graphene or multiple graphene layers by laser annealing. This is described in N. L. Yue, Y. Zhang, and R. Tsu, Ambient condition laser writing of graphene structures on polycrystalline SiC thin film deposited on Si wafer, Appl. Phys. Lett. 102, 071912 (2013), which is herein incorporated by reference in its entirety.

In one embodiment of the present disclosure, the layer of graphene can be single monolayer thick. In another embodiment, the blanket layer of graphene can have multiple monolayers. The layer of graphene can have other thicknesses that are above the ranges mentioned above.

In one embodiment, the graphene layer may be doped.

Graphene has a very high melting temperature (theoretically close to 5000 K). Thus, it places no limit on the growth temperature other than that by the substrate.

Figure 1C:
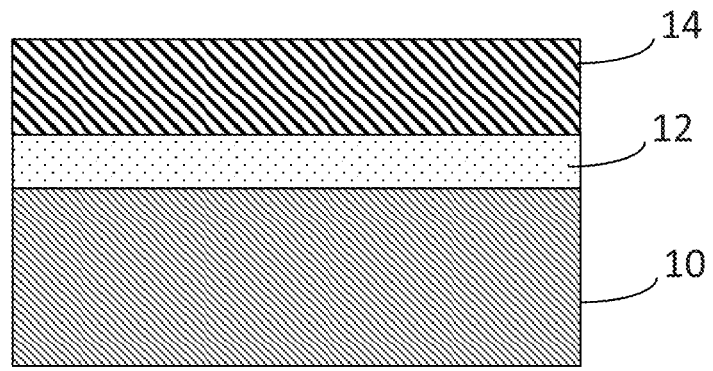

After the graphene layer 12 is deposited on the substrate 10, one or more silicon epitaxial-layers 14 are deposited. In another case, a ZnSe thin-film is deposited on substrate 10. Referring now to FIG. 1C, there is illustrated the structure of FIG. 1B after depositing silicon or other semiconductor materials 14 on an exposed surface of the layer of graphene 12.

As mentioned above, the silicon epitaxial-layers 14 are grown on the graphene interfacial layer transferred on a $SiO_2$/Si substrate (which may have a thickness of between 200 nm to 400 nm, or a thickness of about 300 nm) or directly on graphite substrate. This may be accomplished using any deposition system, such as by using e-beam evaporation under ultra high vacuum ("UHV") in a MBE chamber. The pressure employed by such process may be about $10^{-10}$ Torr.

In one experiment, silicon epitaxial layers were deposited on a graphene interfacial layer, where the graphene interfacial layer was transferred onto a $SiO_2$/Si substrate. The substrate was resistively heated up to 700° C. at which the adsorbed Si atoms could nucleate and grow into a uniformly crystallized atomic structure. To improve the structural homogeneity, the sample was rotated during growth, but this is not required.

Also, liquid nitrogen ("LN") was circulated through the shroud in the wall of growth chamber to cool down the inner wall of the chamber to prevent the residual depositions on the wall from re-evaporation, thereby avoiding the incorporation of impurities.

This process uses a $SiO_2$/Si substrate having a few hundred nm in thickness, with a single graphene layer, resulting in a silicon layer of about 50-100 nm thickness. This structure allows for growth of 3-D crystalline or poly-crystalline materials on foreign substrates (for semiconductors or oxides) or growth of 2-D materials beyond graphene (such as silicene (2-D Si) or Germanene (2-D Ge)), if the growth time thus the epilayer thickness is properly controlled.

Figure 2:
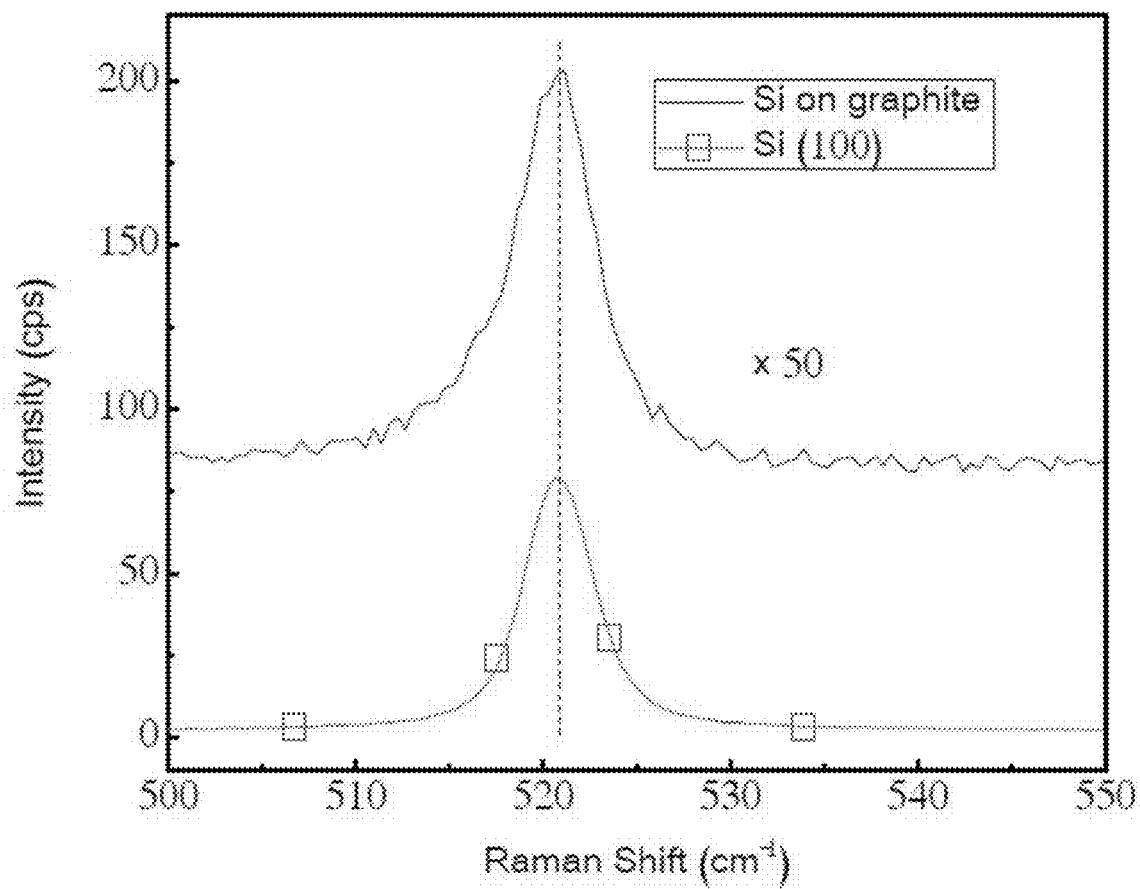
FIG. 2 illustrates a Raman spectrum of Si grown on graphite compared to that of Si single crystal according to one embodiment.

In other experiments, silicon was deposited on a graphite substrate. As illustrated in FIG. 2, a Raman spectra of the silicon on graphite and of bulk silicon is illustrated. Si was grown on both graphene/$SiO_2$/Si and graphite substrate. The use of the data from the graphite substrate is to avoid the potential interference of the Raman signal from the Si substrate underneath the thin $SiO_2$ layer. As is shown, the silicon on the graphite substrate shows no Raman peak shift and very little peak broadening compared to the bulk Si, indicating high crystallinity.

Figure 3:
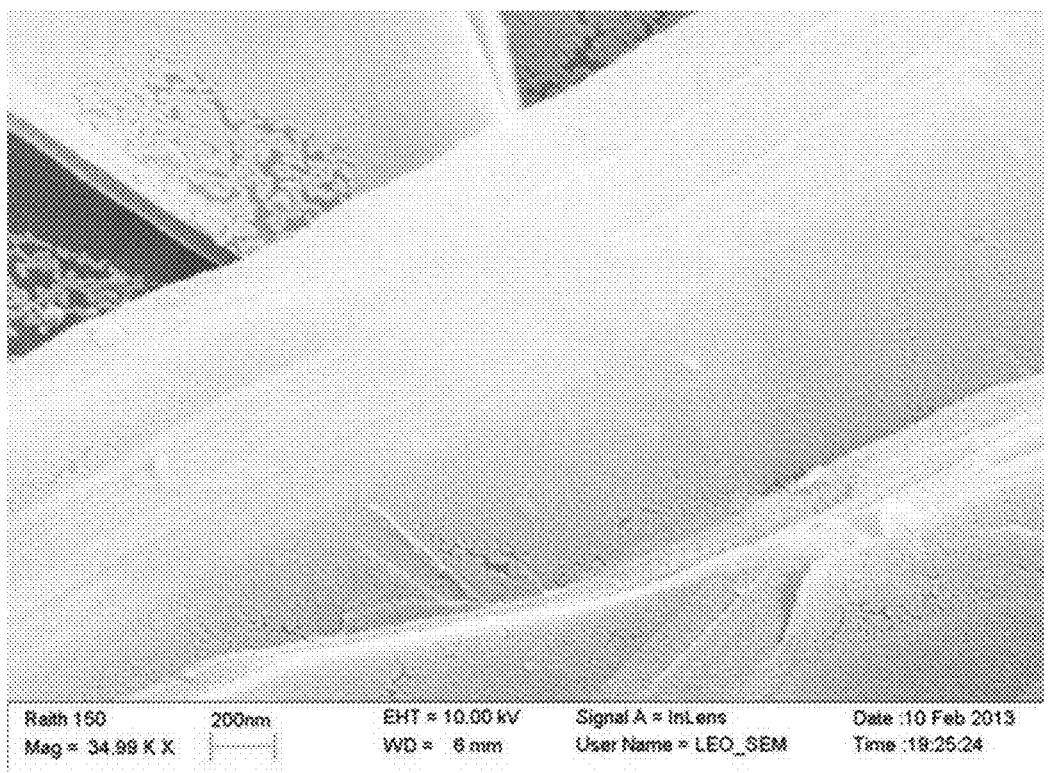
FIG. 3 illustrates SEM images of Si grown on a graphite substrate with unintended steps, according to one embodiment.

FIG. 3 illustrates SEM images of Si grown on a graphite substrate with unintended steps, according to one embodiment.

Figure 4:
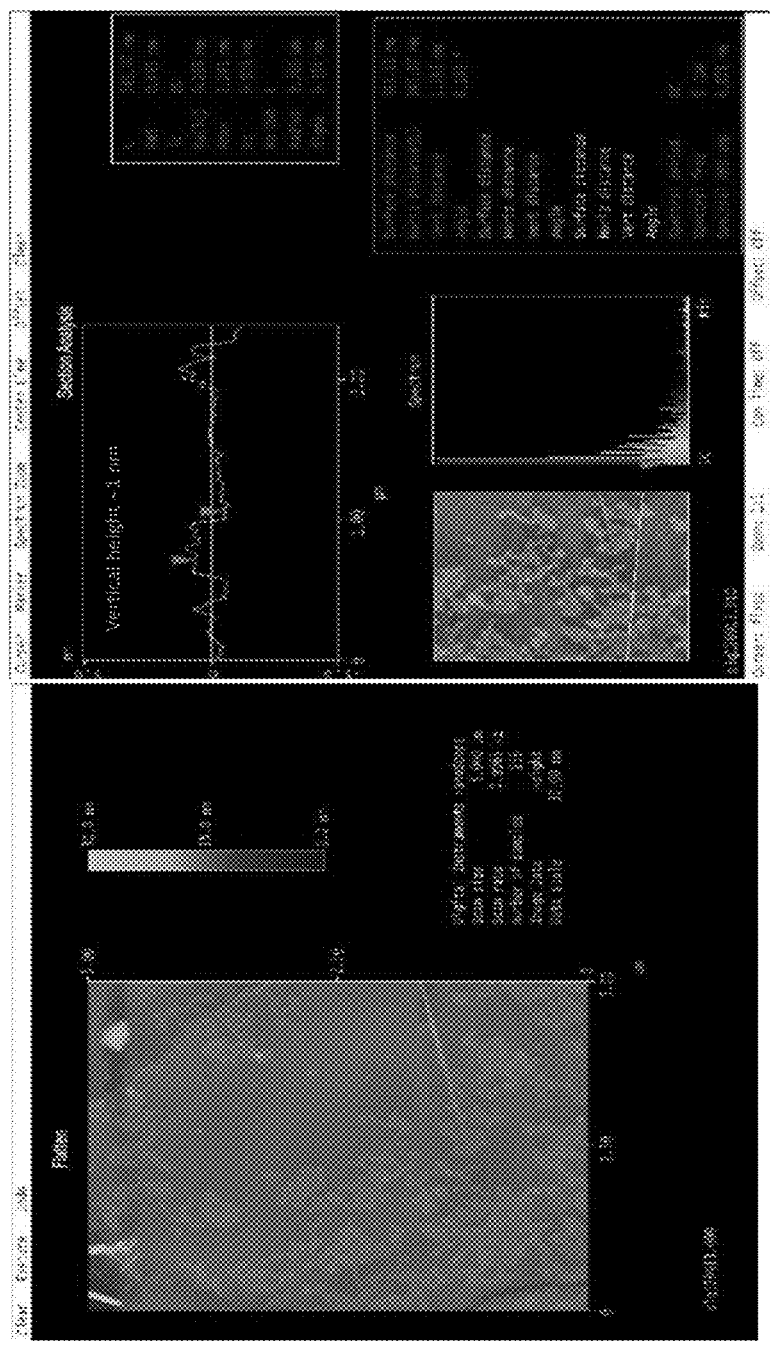
FIG. 4 presents an AFM image of thin Si structures grown on a graphite substrate according to one embodiment.

FIG. 4 presents an AFM image of thin Si structures grown on a graphite substrate according to one embodiment. This figure shows the Si film could be as thin as one nm or about three monolayer thick (silicene is a one-monolayer Si).

Figure 5:
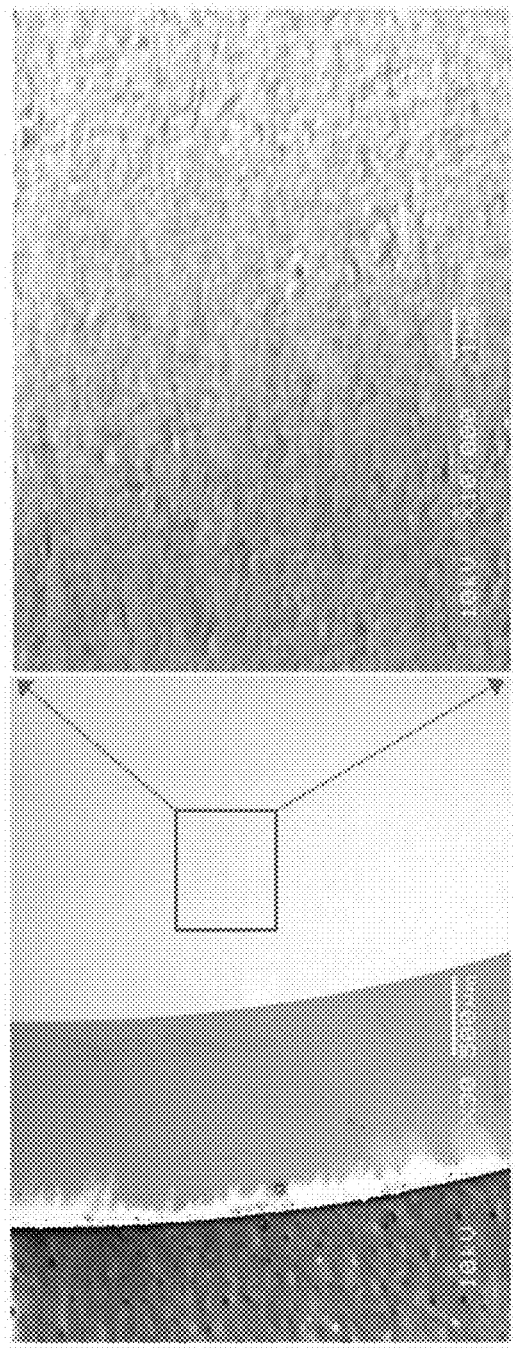
FIG. 5 illustrates a SEM image of Si grown on graphite wafer according to one embodiment.

FIG. 5 illustrates a SEM image of Si grown on a graphite wafer according to one embodiment.

In some aspects, there were attempts by the inventors to achieve the same general structure as the present disclosure. However, there is a contrast between the above-mentioned aspects and some embodiments of the present disclosure. Indeed, the above-mentioned aspects are based on the assumption that the epilayer will not grow on defect-free graphene; and embodiments the present disclosure is based on the opposite assumption that the epitaxial layers will grow on defect-free graphene.

Furthermore, the above-mentioned aspects do not actually shown feasibility. Some embodiments of the present disclosure show that single crystalline Si grows on a graphene sheet in an MBE system with e-beam deposition.

Additionally, the above-mentioned aspects relate to the success of the so-called lateral growth of GaN on lattice mismatched substrate such as sapphire in the field: by initiating the GaN growth on some narrow grooves, then the growth will expand laterally covering the whole substrate with lower defect density than a simple uniform growth over the whole substrate area from the beginning. Such invention suggests to use pattern graphene features as masks, assuming the material will not grow on the area masked out by graphene, and the material growth will initiate from the exposed areas (i.e., where no graphene coverage) and expand laterally afterward in the similar manner as in the known lateral growth method. This device relates to the epilayer and substrate being reasonably lattice matched, because the growth still initiates directly on the substrate from the exposed areas (not covered by graphene). Embodiments of the present disclosure is in contrast to growing the material directly on graphene with any lattice mismatch with the substrate (the lattice size of the substrate is irrelevant).

In another attempted aspect, the general goal was to insert graphene as an electrode layer between the substrate and the epilayer. However, in this attempt, there was thought that the semiconductor would not like to grow on graphene. Therefore, some suggested introducing various possible types of defects as nucleation sites in the graphene sheet for breaking the sp2 pi-bonds in the graphene sheet and forming sp3 bonds. For example, U.S. Patent Application Publication No. 2012/0141799 to Kub et al. explains that a graphene sheet with pi-bonds on the surface are non-reacting material and typically only form weak bonds to atoms deposited on the surface of the graphene sheet. Kub et al. discusses several methods to create nucleation sites on the surface of graphene in order to grow semiconductor layers thereon in order to facilitate the growth of semiconductors on the graphene sheet. Some examples discuss increasing the density of nucleation sites, such as forming sp3 carbon bonds, or forming graphene with a selected density of defects or a selected grain size having grain boundaries.

Some were concerned about the large lattice mismatch between graphene and epilayer to be grown. The present inventors believe the hollow site of the graphene hexagon could serve as the nucleation site, and the growth can occur on the perfect graphene sheet with proper growth conditions. Notably, the present inventors have disclosed growing single crystalline Si on graphene, and polycrystalline ZnSe on graphene that, in turn, was placed on quartz and $SiO_2$ substrate.

In the present application, the term "crystalline graphene" or "crystalline graphene layer" can be substituted for graphene or graphene layer. "Crystalline graphene" or "crystalline graphene layer" refers to graphene or a graphene layer that has not been intentionally or unintentionally modified to increase the number of defects thought to function as nucleation sites. Crystalline graphene" or "crystalline graphene layer" also may be used in this application to describe graphene or a graphene layer that might have unintended limited number of defects and grain boundaries. The term "crystalline graphene" or "crystalline graphene layer" may also be described as graphene or a graphene layer that has been maintained to prevent the formation of nucleation sites after formation of the graphene or graphene layer.

In summary, the present application is under an exactly opposite assumption and for very different purposes, compared to previous attempts. The specific growth conditions the present inventors have identified are important for the realization of the idea.

All of the above description is some optimized implementation method and design choices. Therefore, the foregoing is considered as illustrative only of the principals of the invention. Further, since numerous modifications and changes will readily occur to those skilled in the art, it is not desired to limit the invention to the exact composition and use shown and described, and accordingly, all suitable modifications and equivalents may be restored to, falling within the scope of this invention.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to embodiments of the invention in the form disclosed. Many modifications and variations will be apparent to those of ordinary skill in the art without departing from the scope and spirit of embodiments of the invention. The embodiment was chosen and described in order to best explain the principles of embodiments of the invention and the practical application, and to enable others of ordinary skill in the art to understand embodiments of the invention for various embodiments with various modifications as are suited to the particular use contemplated.

Although specific embodiments have been illustrated and described herein, those of ordinary skill in the art appreciate that any arrangement which is calculated to achieve the same purpose may be substituted for the specific embodiments shown and that embodiments of the invention have other applications in other environments. This application is intended to cover any adaptations or variations of the present invention. The following claims are in no way intended to limit the scope of embodiments of the invention to the specific embodiments described herein.

What is claimed is:

1. An electronic device, comprising:
a substrate;
a crystalline graphene layer deposited on the substrate; and
a semiconductor material deposited on the crystalline graphene layer so that epitaxial layers of the semiconductor material grow on the crystalline graphene layer, wherein the crystalline graphene layer is a graphene layer that has not been intentionally or unintentionally modified to increase the number of defects that function as nucleation sites.

2. The electronic device as in claim 1, wherein the crystalline graphene layer consists of a single atomic layer of carbon.

3. The electronic device as in claim 1, wherein the crystalline graphene layer comprises a plurality of layers of crystalline graphene.

4. The electronic device as in claim 1, wherein the substrate comprises one of a $SiO_2$/Si substrate, a glass substrate, a metal substrate, or a ceramic substrate.

5. The electronic device as in claim 1, wherein the substrate comprises a graphite substrate.

6. The electronic device as in claim 1, wherein the semiconductor material comprises silicon.

7. The electronic device as in claim 1, wherein the semiconductor material comprises silicene.

8. The electronic device as in claim 1, wherein the substrate is one that can withstand a growth temperature without a limitation matching condition required for epitaxial growth.

9. The electronic device as in claim 1, wherein the semiconductor material comprises a crystalline material.

10. The electronic device as in claim 9, wherein the crystalline material has a 2-dimensional Si structure.

11. A method of growing semiconductors on hetero-substrates using graphene as an interfacial layer, the method comprising:
providing a substrate;
depositing a crystalline graphene layer on the substrate;
depositing, using one of e-beam evaporation, molecular beam epitaxy or atomic layer deposition, a silicon epitaxial layer on the crystalline graphene layer so that the silicon epitaxial layer grows on the crystalline graphene layer
wherein the crystalline graphene layer is a graphene layer that has not been intentionally or unintentionally modified to increase the number of defects that function as nucleation sites.

12. The method of claim 11, further comprising providing liquid nitrogen in walls of a growth chamber during deposition of the silicon epitaxial layer on the graphene layer.

13. The method of claim 11, further comprising rotating the substrate during the depositing the crystalline graphene layer.

14. The method of claim 11, further comprising heating the substrate to a predetermined temperature so that absorbed Si atoms nucleate and grow into a uniformly crystalized atomic structure.

15. The method of claim 14, wherein the predetermined temperature is 700 degrees Celsius.

16. The method of claim 11, wherein the substrate comprises $SiO_2$/Si substrate.

17. The method of claim 11, wherein the substrate comprises one of a glass substrate, a metal substrate, or a ceramic substrate.

18. The method of claim 11, wherein the substrate is 300 nm in thickness.

19. A method comprising:
providing a substrate;
transferring a crystalline graphene layer on the substrate; and
depositing, using one of e-beam evaporation, molecular beam epitaxy or atomic layer deposition, a silicon epitaxial layer on the crystalline graphene layer so that the silicon epitaxial layer grows on the crystalline graphene layer,
wherein the crystalline graphene layer is a graphene layer that has not been intentionally or unintentionally modified to increase the number of defects that function as nucleation sites.

20. The method of claim 19, wherein the substrate comprises one of a $SiO_2$/Si substrate or quartz substrate.

* * * * *